(12) United States Patent
Kuo et al.

(10) Patent No.: US 9,275,923 B2
(45) Date of Patent: Mar. 1, 2016

(54) BAND PASS FILTER FOR 2.5D/3D INTEGRATED CIRCUIT APPLICATIONS

(75) Inventors: Feng Wei Kuo, Zhudong Township (TW); Huan-Neng Chen, Taichung (TW); Chewn-Pu Jou, Hsinchu (TW); Shuo-Mao Chen, New Taipei (TW); Der-Chyang Yeh, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 641 days.

(21) Appl. No.: 13/557,457

(22) Filed: Jul. 25, 2012

(65) Prior Publication Data

US 2014/0029205 A1 Jan. 30, 2014

(51) Int. Cl.
*H05K 7/00* (2006.01)
*H01L 21/56* (2006.01)
*H01L 23/31* (2006.01)
*H01L 23/64* (2006.01)
*H01L 23/66* (2006.01)
*H01L 25/16* (2006.01)
*H01L 23/00* (2006.01)

(52) U.S. Cl.
CPC .......... *H01L 23/3128* (2013.01); *H01L 23/642* (2013.01); *H01L 23/66* (2013.01); *H01L 24/24* (2013.01); *H01L 24/82* (2013.01); *H01L 25/16* (2013.01); *H01L 2223/6627* (2013.01); *H01L 2223/6672* (2013.01); *H01L 2224/24195* (2013.01); *H01L 2924/181* (2013.01); *H01L 2924/19011* (2013.01)

(58) Field of Classification Search
CPC H05K 7/00; H01L 21/56; H01L 2224/24137; H01L 23/3128

USPC .......... 333/204, 133, 246, 664; 257/E21.502, 257/E21.508, 528, 664, 758, 778
See application file for complete search history.

(56) References Cited

U.S. PATENT DOCUMENTS

| | | | | |
|---|---|---|---|---|
| 7,312,676 | B2 * | 12/2007 | Kundu | 333/204 |
| 7,554,829 | B2 * | 6/2009 | Forbes et al. | 365/51 |
| 2003/0234706 | A1 * | 12/2003 | Silk et al. | 333/202 |

(Continued)

OTHER PUBLICATIONS

Meenakshi Prashant, et al., "Integrated passive devices (IPD) integration with eWLB (Embedded Wafer Level BGA) for high performance RF applications", Dec. 8-10, 2010, 12th IEEE Electronics Packaging Technology Conference, p. 677-680.*

(Continued)

*Primary Examiner* — Stephen E Jones
*Assistant Examiner* — Scott S Outten
(74) *Attorney, Agent, or Firm* — Eschweiler & Associates, LLC

(57) ABSTRACT

Some embodiments relate to a device and method for a band pass filter with a reduced cost, area penalty, and manufacturing complexity relative to current solutions. An integrated passive device chip includes a plurality of capacitors embedded in a common molding compound along with a transceiver chip. The integrated passive device chip and the transceiver chip are also arranged within a polymer package. An ultra-thick metallization layer is disposed within the polymer package and configured to couple the integrated passive device chip to the transceiver chip. The ultra-thick metallization layer also forms a plurality of transmission lines, wherein the combined integrated passive device chip and transmission lines form a band pass filter with improved frequency response, noise immunity, and cost and area as compared to conventional solutions.

16 Claims, 6 Drawing Sheets

(56) References Cited

U.S. PATENT DOCUMENTS

| | | |
|---|---|---|
| 2004/0124942 A1* | 7/2004 | Kanno .................. 333/22 R |
| 2007/0001786 A1 | 1/2007 | Kundu |
| 2007/0002520 A1* | 1/2007 | Mehr et al. ................ 361/306.1 |
| 2007/0188271 A1 | 8/2007 | Takamine |
| 2011/0148543 A1* | 6/2011 | Bandholz et al. ............... 333/32 |

OTHER PUBLICATIONS

Seung Wook Yoon, et al., "Fanout Flipchip eWLB (embedded Wafer Level Ball Grid Array) Technology as 2.5D Packaging Solutions", May 28-31, 2013, 63rd IEEE Electronic Components and Technology Conference, p. 1855-1860.*

Seung Wook Yoon, et al., "3D eWLB (embedded wafer level BGA) Technology for 3D-Packaging/3D-SiP (Systems-in-Package) Applications", Dec. 9-11, 2009, 11th IEEE Electronics Packaging Technology Conference, p. 915-919.*

Maciej Wojnowski, et al., "A 77 GHz SiGe Mixer in an Embedded Wafer Level BGA Package", May 27-30, 2008, 58th IEEE Electronic Components and Technology Conference, p. 290-296.*

Meenakshi Prashant, et al., "Integrated Passive Devices (IPD) Integration with eWLB (Embedded Wafer Level BGA) for High Performance RF Applications", STATS ChipPAC Ltd., 2010, 2010 Elelctronics Packaging Technology Conference Proceedings, p. 1-5.

\* cited by examiner

|  | IPD Only | IPD + FOWLP | SAW Component |
|---|---|---|---|
| Fc: 925 ~ 960 MHz | TSMC |  | Other |
| IL (dB) | 15 | < 3 | 2.3 – 3.1 |
| Freq (MHz) | Attenuation at Stop Band | | |
| 0.1 ~ 880 | 78 | 87 | 44 ~ 50 |
| 880 ~ 905 | 49 | 50 | 30 ~ 34 |
| 905 ~ 915 | 31 | 25 | 24 ~ 25 |
| 980 ~ 1030 | 40 | 37 | 25 ~ 34 |
| 1030 ~ 2500 | 82 | 91 | 40 ~ 45 |
| 2500 ~ 6000 | < 100 | < 100 | 33 ~ 39 |

Fig. 5

BAND PASS FILTER FOR 2.5D/3D INTEGRATED CIRCUIT APPLICATIONS

BACKGROUND

Band pass filters are used extensively in mobile communications systems such as cellular phones and Wireless LAN to suppress unwanted noise and produce signals with enough gain and narrow frequency range to meet desired specifications. Previous constructions have employed surface acoustical wave (SAW) filters which utilize piezoelectric materials to convert electrical signals into mechanical waves, as well as printed circuit board (PCB) methods. However, these do not always fall into the desired specification range of a given mobile communications system application. Additionally, the cost, die area, and manufacturing complexity of these solutions have failed to keep pace with the rate of miniaturization of other components in mobile communications systems. As such, their relative cost and area penalty have increased.

BRIEF DESCRIPTION OF THE DRAWINGS

FIG. 5 illustrates a table which compares some embodiments of band pass filter parametrics.

DETAILED DESCRIPTION

Figure 1:
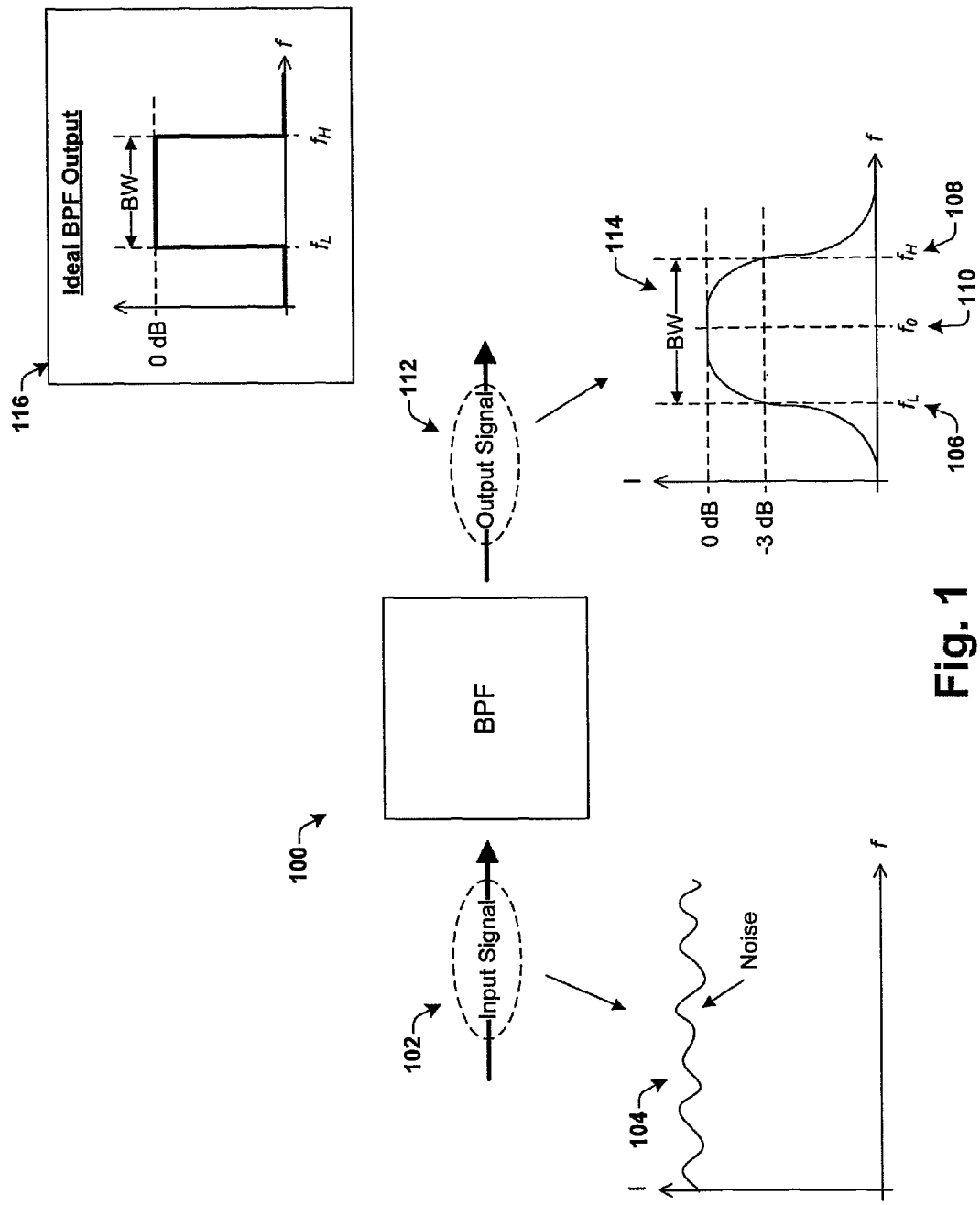
FIG. 1 illustrates the operation of a band pass filter.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

FIG. 1 illustrates the operation of a band pass filter (BPF) 100. An input signal 102 is received which contains wide range of frequency data 104. The input signal 102 may be an analog signal which contains data for transmission as well as data outside the desired frequency range (e.g., noise). Input frequencies below a lower cut-off frequency, $f_L$ 106, and higher than a higher cut-off frequency, $f_H$ 108, are attenuated by the band pass filter 100. This produces an output signal 112 in a desired frequency range, or bandwidth (BW) 114 (i.e., BW=$f_H$−$f_L$) which is centered about a center frequency $f_O$ 110 (i.e., the arithmetic mean of $f_L$ and $f_H$). In an ideal band pass filter the output 116 would show a flat frequency response within the bandwidth 114 (i.e., 0 dB or no attenuation), and completely attenuate frequencies outside the bandwidth 114. In practice, no Band Pass Filter is ideal. In a real band pass filter the bandwidth may be defined as a range between half-power attenuation for the lower cut-off frequency 106 and the higher cut-off frequency 108 (i.e., a gain −3 dB).

Band pass filters are used extensively in mobile communications systems to suppress unwanted noise and produce signals with enough gain and a narrow frequency range to meet desired mobile system specifications (e.g., cell phones, Wireless LAN). Previous constructions have employed surface acoustical wave (SAW) filters which utilize piezoelectric materials to convert electrical signals to mechanical waves for the purpose of filtering, but are limited to frequency ranges below 3 GHz. Other printed circuit board (PCB) methods have also been used, but do not always fall into the desired specification range of a given mobile communication system application. Additionally, the cost, die area, and manufacturing complexity of these previous solutions have failed to keep pace with the rate of miniaturization of other components in mobile communications systems. As such, their relative cost and die area have increased.

Accordingly, the present disclosure relates to a device and method for a band pass filter with a reduced cost, area, and manufacturing complexity relative to current solutions. An integrated passive device chip (IPD chip) comprises a plurality of capacitors embedded in a common molding compound along with a transceiver chip (TRX chip). The integrated passive device chip and the transceiver chip are also arranged within a polymer package. An ultra-thick metallization layer is disposed within the polymer package and configured to couple the integrated passive device chip to the transceiver chip. The ultra-thick metallization layer also forms a plurality of transmission lines, wherein the combined integrated passive device chip and transmission lines form a band pass filter with improved frequency response, noise immunity, and cost, and reduced die area as compared to conventional solutions. The band pass filter may also be coupled to a plurality of solder balls comprising a Flip Chip Ball Grid Array (FCBGA) suitable for 2.5D and 3D integrated circuit applications.

Figure 2:
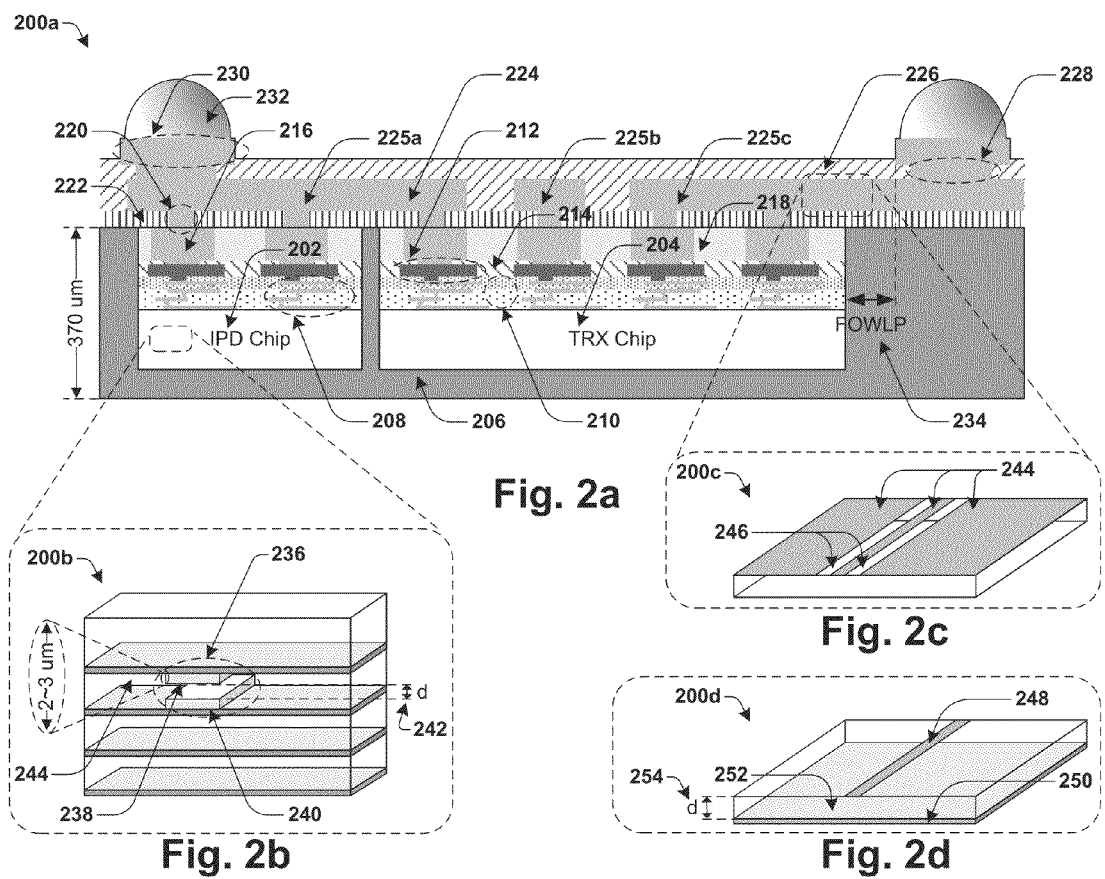
FIG. 2a illustrates some embodiments of a cross-sectional view of a band pass filter.
FIG. 2b illustrates some embodiments of an exploded cross-sectional view of an integrated passive device chip.
FIG. 2c illustrates some embodiments of an exploded cross-sectional view of a transmission line.
FIG. 2d illustrates some embodiments of an exploded cross-sectional view of a transmission line.

FIG. 2a illustrates some embodiments of a cross-sectional view of a band pass filter 200a comprising an integrated passive device chip (IPD chip) 202 and a transceiver chip (TRX chip) 204 both embedded within a common molding compound 206. The IPD chip 202 and the TRX chip 204 are connected to an external connection through copper wiring 208 contained within one or more dielectric layers 210. Aluminum pads 212 provide a connection to the copper wiring 208 though a passivation layer 214. First metal vias 216 are formed within a first polymer layer 218. The first metal vias 216 are connected to the aluminum pads 212, and are contacted by second metal vias 220, which are formed within a second polymer layer 222. Above the second polymer layer 222, an ultra-thick metallization layer 224 is arranged within a third polymer layer 226. The ultra-thick metallization layer 224 is connected to the second metal vias 220. The ultra-thick metallization layer 224 also forms a plurality of transmission lines 225a-225c. Transmission line 225a couples the IPD chip 202 to the TRX chip 204. The first polymer layer 218, second polymer layer 222, and third polymer layer 226 collectively establish a polymer package for the IPD chip 202 and TRX chip 204. The polymer package (218, 222, 226) and the common molding compound 206 collectively form a body that encapsulates the IPD chip 202 and TRX chip 204. Third metal vias 228 connect the ultra-thick metallization layer 224 to under ball metal regions 230 which in turn connect to a plurality of first solder balls 232.

The plurality of first solder balls 232 may collectively form a ball grid array (BGA) (not shown). The plurality of first solder balls 232 are positioned such that they are not arranged directly over the IPD chip 202 or TRX chip 204. Instead, they are spread out laterally over the common molding compound 206 to form a Fan Out Wafer Level Package (FOWLP) 234.

FIG. 2b illustrates some embodiments of an exploded cross-sectional view of an integrated passive device chip 200b that is arranged within the common molding compound 206. The integrated passive device chip 200b contains a plurality of capacitors, wherein a respective capacitor 236 is formed from a first metallization layer which forms a lower plate 238 and a second metallization layer which forms an upper plate 240. The lower plate 238 and upper plate 240 are separated by distance (d) 242, which is occupied by a first dielectric layer 244.

FIG. 2c illustrates some embodiments of an exploded cross-sectional view of a transmission line 200c comprising multiple metal strips 244 formed on the ultra-thick metallization layer 224, wherein a dielectric layer 246 separates the metal strips.

FIG. 2d illustrates some embodiments of an exploded cross-sectional view of a transmission line 200d, comprising a metal strip 248 arranged formed-on the ultra-thick metallization layer 224, a ground plane 250 arranged on a third metallization layer, and a dielectric layer 252 that separates the ultra-thick metallization layer from the third metallization layer by a distance (d) 254.

The capacitors of the IPD chip 202 and transmission lines arranged on the ultra-thick metallization layer 224 collectively establish the reactive components of the band pass filter 200a. The inclusion of the Fan Out Wafer Level Package 234 increases a quality factor of the band pass filter 200a, as will be addressed in subsequent embodiments. The solder balls 232 comprise a Flip Chip BGA (FCBGA), wherein "flip chip" describes a method of connecting the band pass filter 200a to a package substrate flipped or face down.

Figure 3:
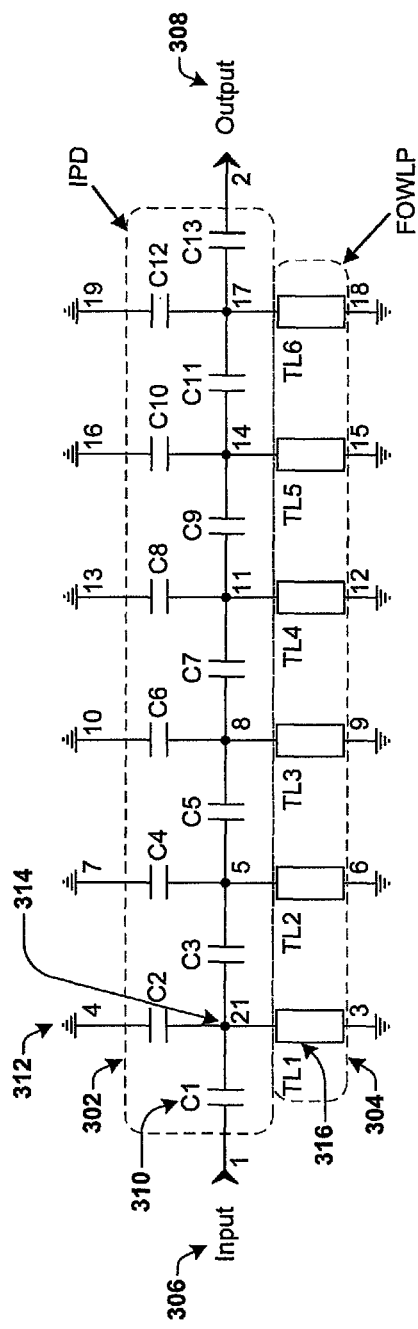
FIG. 3 illustrates some embodiments of a schematic of a band pass filter.

FIG. 3 illustrates some embodiments of a schematic of a band pass filter 300, comprising an integrated passive device chip (IPD chip) 302 and a Fan Out Wafer Level Package (FOWLP) 304. An input signal 306 is received by the band pass filter 300 which contains a wide range of frequency data. The input signal 306 may be an analog signal which contains data from a transceiver chip (not shown) as well data outside the desired frequency range (e.g., noise). The band pass filter attenuates frequencies outside a desired bandwidth to produce an output signal 308.

In this non-limiting example, the IPD chip 302 comprises a plurality of capacitors (C1-C13) 310 which operate in the range of approximately 0.071 pF~0.626 pF. Odd numbered capacitors 310 (e.g., C1, C3, C5, C7, C9, C11, and C13) form series connections between the input 306 and the output 308. Even numbered capacitors 310 (e.g., C2, C4, C6, C8, C10, and C12) form parallel connections to ground 312. The odd numbered capacitors 310 are configured such that each pair are coupled to a node or pin 314 that is also coupled to one of the even numbered capacitors (e.g., C1, C2, and C3 are coupled to the same node or pin, C3, C4, and C5 are coupled to the same node or pin, etc.). Each pin 314 is also coupled to a one of a plurality of transmission lines TL1-TL6 316 comprising the FOWLP 304. Transmission lines TL1-TL6 316 operate with an impedance of approximately 50 Ω and a phase angle of approximately 90°, and form parallel connections to ground 312. This combination of capacitors 310 and transmission lines 316 configured in parallel and series give the band pass filter 300 its passband characteristic.

Figure 4A:
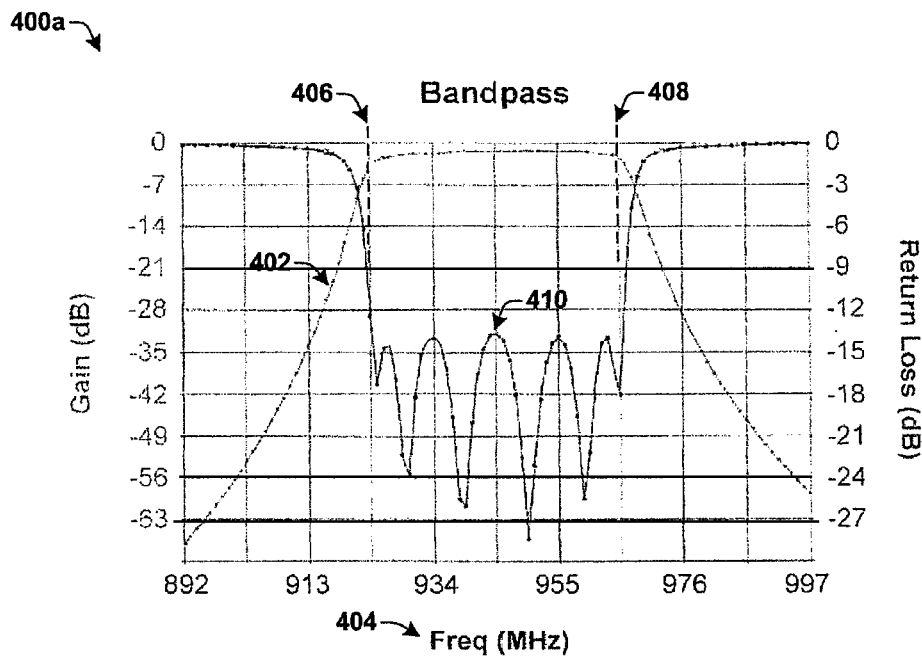
FIG. 4a illustrates some embodiments of a measurement of a passband characteristic.

FIG. 4a illustrates some embodiments of a measurement of a passband characteristic 400a of band pass filter in accordance with the present disclosure, wherein a gain 402 is plotted as a function of frequency 404. The gain 402 demonstrates a lower cut-off frequency $f_L$ of 925 MHz 406, and a higher cut-off frequency $f_H$ of 960 MHz 408. Consequently, input frequencies in a bandwidth range of approximately 925 MHz~960 MHz are attenuated by less than half-power (i.e., a gain>−3 dB), while frequencies outside this range are attenuated by greater than half-power (i.e., a gain≤−3 dB). The passband characteristic 400a also demonstrates a return loss (RL) 410 associated with a reflection of an input signal outside the bandwidth range resulting from an impedance mismatch between an input signal and the band pass filter. A return loss 410 defines the amount of signal reflected by a filter to the amount received $$RL(dB) = -10\log_{10}\left(\frac{Power_{reflected}}{Power_{incident}}\right),$$

such that an input signal which is totally reflected has a return loss of 0 dB. The return loss 410 of the filter approaches 0 dB in a region outside the bandwidth range, and is approximated by a $6^{th}$-order Chebyshev response within the bandwidth range.

Figure 4B:
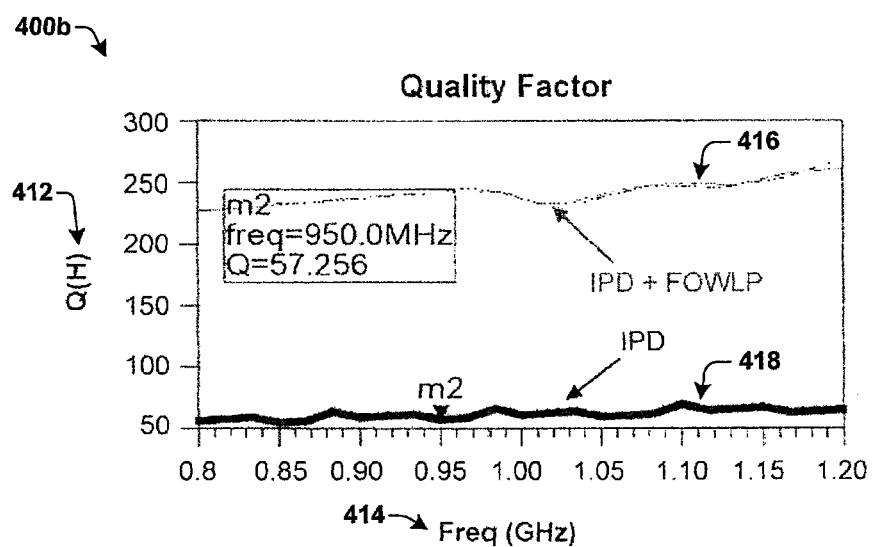
FIG. 4b illustrates some embodiments of a quality factor characteristic.

FIG. 4b illustrates some embodiments of a quality factor characteristic 400b of two band pass filters, wherein a quality factor 412 is plotted as a function of frequency 414. The quality factor 412 is defined as the ratio of the band pass filter's center frequency to its bandwidth, and measures the energy loss of a signal as it moves through the band pass filter. A first quality factor measurement 416 is made for the band pass filter 300, which demonstrates a quality factor of approximately 225~325 for a frequency range of approximately 0.8 GHz~1.2 GHz. In contrast, a second quality factor measurement 418 made only on the IPD chip 302 of the band pass filter 300 (i.e., no FOWLP 304) demonstrates a quality factor of approximately 50~60 over the same frequency range. This demonstrates approximately 5× decrease in energy loss when a FOWLP is used as described in the embodiments of the band pass filter 200a and associated schematic of a band pass filter 300.

FIG. 5 illustrates a table 500 which compares some embodiments of band pass filter parametrics for an IPD only chip 502 (e.g., the IPD chip 302), an IPD+FOWLP chip 504 (e.g., the band pass filter 300), and other SAW filters 506, for a center frequency range 508 of approximately 925 MHz~960 MHz. An insertion loss (IL) 510 defines the amount of signal transmitted by a filter to the amount received $$IL(dB) = -10\log_{10}\left(\frac{Power_{transmitted}}{Power_{incident}}\right),$$

such that an input signal that is totally transmitted has an insertion loss of 0 dB. The insertion loss 510 of the IPD only chip 502 is approximately 15 dB, compared to <3 dB for the IPD+FOWLP chip 504, and approximately 2.3 dB~3.1 dB for other SAW filters 506. Additionally, attenuation at a stop band for the IPD+FOWLP chip 504 is larger than or equal to that of the other SAW filters 506 for frequency ranges 512 between approximately 0 GHz~6.0 GHz. Although FIG. 5 is not meant to be representative of all band pass filter parametrics for all BPFs in any way, it does tend to show that the proposed implementations can provide significant performance compared to some prior art approaches.

Figure 6:
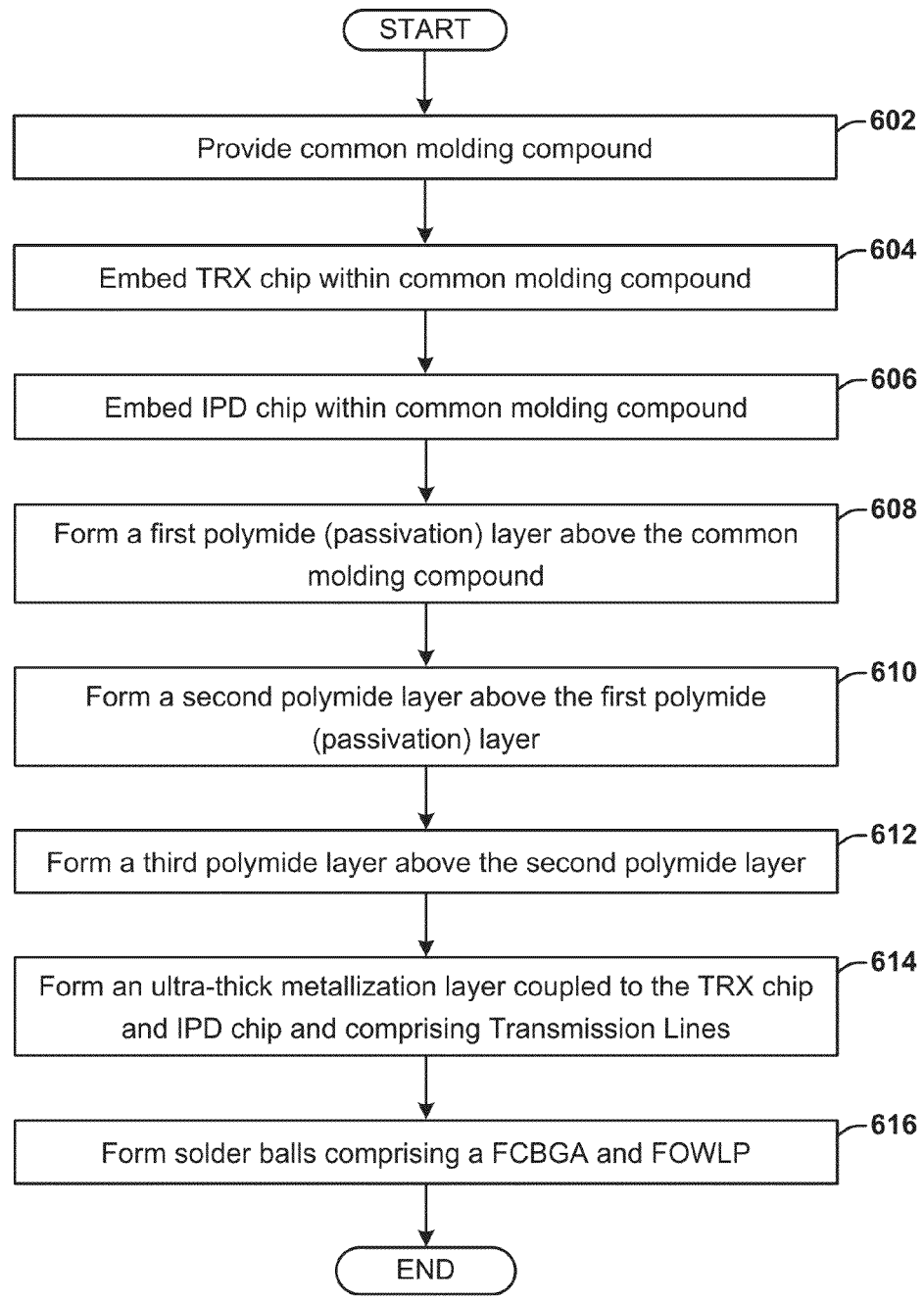
FIG. 6 illustrates a flow diagram of some embodiments of a method to create a band pass filter.

FIG. 6 illustrates a flow diagram of some embodiments of a method to create a band pass filter. While method 600 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 602, a common molding compound is provided, wherein the common molding compound may comprise an epoxy layer.

At 604, a transceiver chip (TRX chip) is embedded within the molding compound. The TRX chip may comprise a transmitter that transmits an RF signal for mobile communications applications.

At 606, an integrated passive device chip (IPD chip) is embedded within the molding compound adjacent the transceiver chip. The IPD chip may comprise a plurality of capacitors formed on one or more metallization layers that are separated by one or more dielectric layers.

At 608, a first polymer packaging layer is formed above the common molding compound, wherein the first polymer packaging layer may comprise a polyimide passivation layer.

At 610, a second polymer packaging layer is formed above the first polymer packaging layer. The second polymer packaging layer may comprise a polyimide stress layer that absorbs stresses that result from thermal cycling and promotes adhesion of the first polymer packaging layer.

At 612, a third polymer packaging layer is formed above the second polymer packaging layer. The first polymer packaging layer, second polymer packaging layer, and third polymer packaging layer collectively establish a polymer package for the IPD chip and TRX chip.

At 614, an ultra-thick metallization layer is formed within the third polymer packaging layer. The ultra-thick metallization layer is coupled to the transceiver chip and the integrated passive device chip, and comprises transmission lines.

At 616, a plurality of first solder balls are coupled to the ultra-thick metallization layer through under ball metal regions and vias. The plurality of first solder balls may comprise a Flip Chip Ball Grid Array (FCBGA) positioned to form a Fan Out Wafer Level Package (FOWLP) over the common molding compound.

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein; such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the present disclosure relates to a device and method for a band pass filter with a reduced cost, area, and manufacturing complexity relative to current solutions. An integrated passive device chip (IPD chip) comprises a plurality of capacitors embedded in a common molding compound along with a transceiver chip (TRX chip). The integrated passive device chip and the transceiver chip are also and arranged within a polymer package. An ultra-thick metallization layer is disposed within the polymer package and configured to couple the integrated passive device chip to the transceiver chip. The ultra-thick metallization layer also forms a plurality of transmission lines, wherein the combined integrated passive device chip and transmission lines form a band pass filter with improved frequency response, noise immunity, and cost and area as compared to conventional solutions. The band pass filter may also be coupled to a plurality of solder balls comprising a Flip Chip Ball Grid Array (FCBGA) suitable for 2.5D and 3D integrated circuit applications.

In some embodiments, the band pass filter comprises an integrated passive device chip arranged within a polymer package and comprising a plurality of capacitors, wherein respective capacitors comprise one or more metallization layers, and a first dielectric layer separating the one or more metallization layers. The band pass filter also comprises an ultra-thick metallization layer disposed within the polymer package, and including a plurality of transmission lines, wherein respective transmission lines are configured to couple the integrated passive device chip to a transceiver chip. The integrated passive device chip and transceiver chip are embedded within a common molding compound.

In some embodiments, the band pass filter comprises an integrated passive device chip arranged within a polymer package and comprising a plurality of capacitors, wherein respective capacitors comprise a plurality of metal plates comprising one or more metallization layers, and a first dielectric layer separating the metal plates. The band pass filter also comprises an ultra-thick metallization layer disposed within the polymer package and configured to couple the integrated passive device chip to a transceiver chip. A plurality of transmission lines comprising one or more metal strips arranged on the ultra-thick metallization layer with a second dielectric layer adjacent to the metal strips. The integrated passive device chip and the transceiver chip are embedded within a common molding compound and coupled to a plurality of solder balls comprising a ball grid array. The ball grid array is coupled to the ultra-thick metallization layer. The solder balls are not positioned directly above or below the transceiver chip.

In some embodiments, the band pass filter comprises a first passive interposer coupled to the ball grid array, wherein the first passive interposer is configured to redistribute current from the ball grid array.

In some embodiments, the band pass filter comprises an active die coupled to the ball grid array, wherein the active die comprises electrically active devices, and a second passive interposer coupled to the active die, wherein the second passive interposer is configured to redistribute current from the active die.

In some embodiments the present disclosure relates to a method of forming a filter, comprising forming an integrated passive device chip comprising a plurality of capacitors, wherein respective capacitors comprise one or more metallization layers, and a first dielectric layer separating the one or more metallization layers. The method for forming a filter also comprises embedding the integrated passive device chip and a transceiver chip within a common molding compound, forming an ultra-thick metallization layer within one or more polymer packaging compounds, and configuring the ultra-thick metallization layer to couple to the integrated passive device chip and to the transceiver chip. The method of forming a filter also comprises forming a plurality of transmission lines within the ultra-thick metallization layer, connecting the transmission line to a plurality of solder balls into a ball grid array, wherein respective solder balls do not form in a region over the transceiver chip.

What is claimed is:

1. A filter, comprising:
   a polymer package and common molding compound that collectively form a body;
   a passive device chip disposed within the body, and comprising a plurality of capacitors;
   a transceiver chip disposed within the body, and comprising a plurality of active devices; and
   a plurality of transmission lines, which electrically connect the passive device chip and the transceiver chip to a solder bump or pin arranged on an outer surface of the body;
   wherein the polymer package is arranged over respective upper surfaces of the passive device chip, the transceiver chip, and the common molding compound;
   wherein a first subset of the plurality of capacitors are connected in series along a path extending continuously between an input and an output of the filter, and wherein respective capacitors are coupled by respective nodes on the path; and
   wherein a second subset of the plurality of capacitors are connected in parallel between the respective nodes and a ground terminal.

2. The filter of claim 1, wherein a subset of the plurality of transmission lines are electrically connected to a plurality of solder balls comprising a ball grid array.

3. The filter of claim 2, wherein the plurality of solder balls are not positioned directly above or below the transceiver chip.

4. The filter of claim 1, wherein the passive device chip and the transceiver chip are electrically connected by a transmission line of the plurality of transmission lines through:
   first metal vias arranged within a first polymer layer arranged over the respective upper surfaces of the passive device chip, the transceiver chip, and the common molding compound; and
   second metal vias, which are electrically connected to the first metal vias, and which are arranged within a second polymer layer that is arranged over the first polymer layer.

5. The filter of claim 1, wherein the passive device chip does not contain active devices.

6. The filter of claim 1, wherein a node is also connected to a transmission line of the plurality of transmission lines.

7. The filter of claim 1,
   wherein a capacitor comprises two or more capacitor metallization layers; and
   wherein a transmission line comprises a transmission line metallization layer, which is thicker than the two or more capacitor metallization layers.

8. A filter, comprising:
   a polymer package and common molding compound that collectively form a body;
   an integrated passive device chip arranged within the body and comprising a plurality of capacitors, wherein respective capacitors comprise two or more capacitor metallization layers, and at least one first dielectric layer separating the two or more capacitor metallization layers; and
   a transmission line metallization layer disposed within the body, and including a plurality of transmission lines patterned therein, wherein the transmission line metallization layer is configured to couple the integrated passive device chip to a transceiver chip;
   wherein a first subset of the plurality of capacitors are connected in series along a path extending continuously between an input and an output of the filter, and wherein respective capacitors are coupled by respective nodes on the path; and
   wherein a second subset of the plurality of capacitors are connected in parallel between the respective nodes and a ground terminal.

9. The filter of claim 1, wherein:
   the transmission line metallization layer is coupled to a plurality of solder balls comprising a ball grid array; and
   respective solder balls are not positioned directly above or below the transceiver chip.

10. The filter of claim 1, wherein the capacitor metallization layer has a thickness of approximately 3 microns or less.

11. The filter of claim 1, wherein the transmission line metallization layer has a thickness of approximately 15 microns or less.

12. The filter of claim 1, wherein the thickness of the common molding compound is approximately 370 microns or less.

13. The filter of claim 1, wherein the transmission line metallization layer is thicker than a capacitor metallization layer.

14. A filter, comprising:
   a polymer package and common molding compound that collectively form a body;
   an integrated passive device chip arranged within the body and comprising a plurality of capacitors, wherein respective capacitors comprise a plurality of metal plates comprising one or more capacitor metallization layers, and at least one first dielectric layer separating the metal plates;
   a transceiver chip arranged within the body;
   a plurality of transmission lines patterned in a transmission line metallization layer within the body and configured to couple the integrated passive device chip to the transceiver chip; and
   a plurality of solder balls comprising a ball grid array, wherein the ball grid array is coupled to the plurality of transmission lines, and wherein the plurality of solder balls are not positioned directly above or below the transceiver chip;
   wherein a first subset of the plurality of capacitors are connected in series along a path extending continuously between an input and an output of the filter, and wherein respective capacitors are coupled by respective nodes on the path; and
   wherein a second subset of the plurality of capacitors are respectively connected in parallel between the respective nodes and a ground terminal.

15. The filter of claim 14, wherein the transmission line metallization layer is thicker than a capacitor metallization layer.

16. The filter of claim 14, wherein a subset of the plurality of transmission lines are connected in parallel between the first subset of the plurality of capacitors and the ground terminal.

* * * * *